Sept. 21, 1965 SHIGEAKI MABUCHI 3,207,914

FREQUENCY DIVIDING SYSTEM EMPLOYING TUNNEL DIODE ASTABLE MULTIVIBRATORS

Filed Aug. 29, 1960

Inventor
S. Mabuchi
By Glascock Downing & Seebold
Attys.

United States Patent Office 3,207,914

Patented Sept. 21, 1965

3,207,914

FREQUENCY DIVIDING SYSTEM EMPLOYING TUNNEL DIODE ASTABLE MULTIVIBRATORS

Shigeaki Mabuchi, Hamamatsu-shi, Japan, assignor to Nihon Gakki Seizo Kabushiki Kaisha, Hamamatsu-shi, Japan Filed Aug. 29, 1960, Ser. No. 52,535
Claims priority, application Japan, Oct. 23, 1959, 34/33,269
4 Claims. (Cl. 307—88.5)

This invention relates to frequency dividing systems, and more particularly it relates to a new and improved frequency dividing system which utilizes tunnel diodes (commonly called Ezaki diodes).

It is an object of this invention to provide a frequency dividing system which is stable, has a long life, yet entails low cost.

It is another object of this invention to provide a frequency dividing system as described above by use of a simple electrical circuit.

The manner in which the foregoing as well as other objects and advantages may best be achieved will be understood more fully from a consideration of the following description, taken in conjunction with the accompanying drawing in which.

Figure 2:
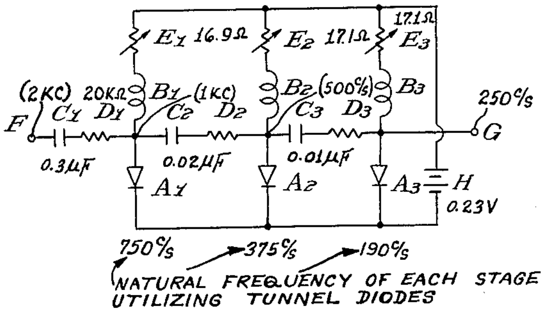
FIG. 2 is a circuit diagram showing one representative embodiment of the invention.
Figure 3:
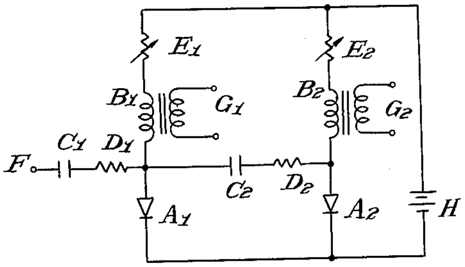
FIG. 3 is a circuit diagram showing one modification of the embodiment of FIG. 2.

In FIGS. 2 and 3 the same or like elements are designated respectively by the same reference symbols.

Figure 1:
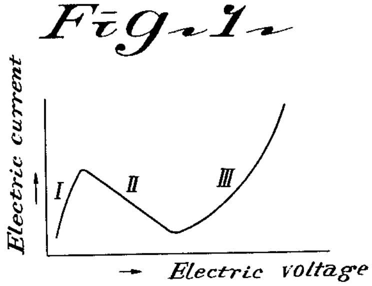
FIG. 1 is a graphical representation indicating the electric current and voltage characteristic of the tunnel diode used in the system of the invention.

The tunnel diode used in the system of this invention is a semiconductor element having a so-called negative resistance characteristic, and its electric current versus voltage characteristic in the forward direction is as indicated in FIG. 1. In the region I, the current increases rapidly with increase in voltage, but as the voltage is increased further into a region II, a negative resistance occurs, whereby the current decreases with increase in voltage. However, if the voltage is increased still further into a region III which indicates positive resistance, the current increases with increase in voltage.

If the region II, indicating the aforesaid negative resistance, is utilized, it will be possible to create an astable multivibrator. For this purpose, the load is so chosen that the load characteristic line intersects the said characteristic curve of the diode in the region II at only one point.

Generally, when a periodic signal is applied to an oscillator from an external source, there usually occurs the phenomenon that said oscillator is synchronized by said outside signal. In this case, synchronization of the oscillator becomes effective when higher harmonic components are contained in the oscillation waves.

This application carries out frequency division by utilizing said phenomenon. In this application, an external periodic signal is applied to the relaxation oscillator formed by tunnel diodes and coil whereby the oscillation frequency is synchronized with $1/n$ of the signal frequency, wherein $n$ is a positive integer, that is, $n=1, 2, 3, 4, \ldots$ As a practical effective range, $n$ may be 1–20. However, in order to carry out frequency division having a ratio greater than 1:20, a more complicated circuit is necessary.

Such a frequency divider formed by a three stage cascade connection is shown in FIG. 2.

In this divider, output of a first stage relaxation oscillator is applied to the second relaxation oscillator, thus synchronizing said second relaxation oscillator. Similarly, the third stage relaxation oscillator is synchronized by the output of the second stage.

$n$ is varied depending upon various factors such as frequency, wave form, voltage, and current of the external signal, and natural frequency, wave form, voltage, current of the relaxation oscillator. However, in the most favorably set condition, for the purpose of obtaining $1/n$ division in the synchronization by pulses, the external frequency must be maintained at a value which is $2n$ to $(n+1)$ times the natural frequency.

In the case wherein the outside signal is of sine wave form, the relation becomes more complicated than the above-mentioned case. In this case, in order to obtain a frequency division 2 in the most favorable condition, the outside frequency must be from $$\frac{1-\frac{1.1}{\pi n}}{n-\frac{1.1}{2\pi}} \text{ to } \frac{1}{n-\frac{1.1}{2\pi}}$$

times the natural frequency.

The description of the above fact has been published, for example, in Millman, Taub; Pulse and Digital Circuits, chapter 12, McGraw Hill, 1956.

For simplicity, let the oscillation frequency of the aforesaid astable multivibrator be designated by $f_0$. Then, if the said astable multivibrator is synchronized, by a signal, from the outside, of a frequency $f$ which is higher than $2f_0$ but less than $3f_0$, it will be possible to extract a signal of a frequency $f/2$. By varying the oscillation frequency of the unstable-type multivibrator, it is possible, through exactly the same principle, to effect frequency division of $1/n$ where $n$ is an integer, and if these circuits of $m$ stages are connected in cascade, it will become possible to effect frequency division of $1/n^m$.

One representative embodiment, by way of example, is shown in FIG. 2. In this case, an example of three-stage cascade connection is used. The essential elements of the circuit are: tunnel diodes $A_1$, $A_2$, and $A_3$; load coils $B_1$, $B_2$, and $B_3$ for determining the oscillation frequency; condensers $C_1$, $C_2$, $C_3$ for blocking direct current; coupling resistance $D_1$, $D_2$, and $D_3$, variable resistances $E_1$, $E_2$, and $E_3$ for adjusting the oscillation conditions, which may be replaced by fixed resistances; at input terminal F through which the frequency to be divided enters; an output terminal G through which the divided frequency is led out and a direct-current power source H.

In a practical embodiment of the invention, the values of the components and the frequencies of the input signal and each of the oscillator stages is as shown in FIG. 2. The inductances of coils $B_1$, $B_2$ and $B_3$ are 52 mh., 158 mh. and 310 mh., respectively. In this embodiment, the values of resistances $D_2$ and $D_3$ are so small as to be effectively zero.

In the case of a frequency division of ½ in each stage in FIGURE 2, when the input frequency is assumed to be 1.86 kc.–2.63 kc., the frequency of the output at terminal G is ⅛ of the input frequency. However, when the input frequency varies to a greater extent that the range indicated above, the ⅛ synchronization is not carried out.

In the modified embodiment shown in FIG. 3, the extraction of the divided frequency from each stage is illustrated, the case of two stages being shown by way of example. The elements $A_1$, $A_2$, $C_1$, $C_2$, $D_1$, $D_2$, $E_1$, $E_2$, F, and H are the same as their equivalents in FIG. 2, but $B_1$ and $B_2$ are each provided with secondary windings, and the terminals of these secondary sides are used as the output terminals $G_1$ and $G_2$. By this arrangement it is possible to extract output from each stage with any impedance, independently of the frequency division operation. Moreover, output may be extracted from the points of the various stages corresponding to the output terminal G of the embodiment shown in FIG. 2.

Furthermore, depending on the circumstances, the condensers $C_1$, $C_2$, and $C_3$ for blocking direct current may be removed without affecting the frequency division operation.

By the utilization of the negative resistance characteristic of the tunnel diode as described above, the system of the invention has succeeded in accomplishing stable, long-life, yet low-cost frequency division by means of a simple circuit. As will be appreciated from the above description, the number of elements used in the present system is extremely small. Moreover, not even a single element having unstable factors in used. Furthermore, the tunnel diodes which function as the core of the operation are easily fabricated, have semi-permanent durability, and perform stably with respect to various external influences.

Since it is obvious that many changes and modifications can be made in the above described details without departing from the nature and spirit of the invention, it is to be understood that the invention is not to be limited to the details described herein except as set forth in the appended claims.

I claim:

1. A frequency divider comprising, a tunnel diode exhibiting a voltage-controlled negative resistance in the low forward voltage range of its current-voltage characteristic; bias means in circuit with said diode for establishing a direct current load line which intersects the current-voltage characterstic of said diode only in the negative resistance region of said diode; a loading coil connected in series with said bias means and said tunnel diode forming a relaxation oscillator of a frequency $f$; and a series circuit including a condenser and a resistor coupling a source of power of periodic signals of a frequency $f_0$ which is slightly more than $2f$ but less than $3f$ to a point where said tunnel diode and said loading coil are connected to each other, in order to derive an output frequency of $f_0/2$.

2. A frequency divider according to claim 1, including at least two of said relaxation oscillators, each of said relaxation oscillators acting as a frequency divider, each of said relaxation oscillators having coupling means therebetween, each of said coupling means connecting to a common point of said tunnel diode and said loading coil of each of said relaxation oscillators, said coupling means connecting said relaxation oscillators in a cascade relationship, one of said relaxation oscillators having substantially a frequency of $f$, another of said relaxation oscillators having substantially a frequency of $f/2$, whereby the cascade relationship of the relaxation oscillators provides for further frequency division.

3. A frequency divider according to claim 2, said coupling means including a series connected capacitor.

4. A frequency divider according to claim 1, including a plurality of said relaxation oscillators, coupling means between each of said relaxation oscillators, said relaxation oscillators forming cascaded frequency dividers, and output means for each of said relaxation oscillators, whereby frequency divided signals may be extracted from each of the relaxation oscillators.

References Cited by the Examiner

UNITED STATES PATENTS

| | | | |
|---|---|---|---|
| 2,958,046 | 10/60 | Watters | 307—88.5 |
| 2,978,576 | 4/61 | Watters | 307—88.5 X |
| 3,076,944 | 2/63 | Watters | 307—88.5 X |

OTHER REFERENCES

Pub. I: 1960 International Solid-State Circuits Conference-Digest of Technical Papers, February 1960; Pub.: Lewis Winner, N.Y., pages 8 and 9.

RCA Technical Notes No. 356, June 1960, "Tunnel Diode Amplifier," by Huo-Bing Yin.

ARTHUR GAUSS, *Primary Examiner.*

HERMAN KARL SAALBACH, JOHN W. HUCKERT, *Examiners.*